United States Patent
Liu et al.

(10) Patent No.: US 8,809,178 B2
(45) Date of Patent: Aug. 19, 2014

(54) METHODS OF FORMING BULK FINFET DEVICES WITH REPLACEMENT GATES SO AS TO REDUCE PUNCH THROUGH LEAKAGE CURRENTS

(75) Inventors: Yanxiang Liu, Wappinger Falls, NY (US); Michael Hargrove, Clinton Corners, NY (US); Xiaodong Yang, Hopewell Junction, NY (US); Hans van Meer, Newburgh, NY (US); Laegu Kang, Hopewell Junction, NY (US); Christian Gruensfelder, Hopewell Junction, NY (US); Srikanth Samavedam, Fishkill, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 25 days.

(21) Appl. No.: 13/408,139

(22) Filed: Feb. 29, 2012

(65) Prior Publication Data

US 2013/0224945 A1 Aug. 29, 2013

(51) Int. Cl.
*H01L 21/4763* (2006.01)
(52) U.S. Cl.
USPC ............... 438/595; 57/330; 57/288; 438/299; 438/151; 438/284
(58) Field of Classification Search
USPC ........... 257/330, 288; 438/299, 151, 284, 595
See application file for complete search history.

(56) References Cited

U.S. PATENT DOCUMENTS

| | | | |
|---|---|---|---|
| 6,770,516 B2 | 8/2004 | Wu et al. | |
| 6,909,147 B2 | 6/2005 | Aller et al. | |
| 6,921,982 B2 | 7/2005 | Joshi et al. | |
| 7,009,250 B1 | 3/2006 | Mouli | |
| 7,105,390 B2* | 9/2006 | Brask et al. | 438/149 |
| 7,122,412 B2 | 10/2006 | Chen et al. | |
| 7,187,046 B2 | 3/2007 | Wu et al. | |
| 7,198,990 B2 | 4/2007 | Joshi et al. | |
| 7,235,468 B1 | 6/2007 | Mouli | |
| 7,268,396 B2 | 9/2007 | Lee et al. | |
| 7,332,386 B2 | 2/2008 | Lee et al. | |
| 8,076,231 B2 | 12/2011 | Saitoh et al. | |
| 2007/0063261 A1 | 3/2007 | Chen et al. | |
| 2007/0108514 A1* | 5/2007 | Inoue et al. | 257/330 |
| 2009/0278196 A1 | 11/2009 | Chang et al. | |

(Continued)

OTHER PUBLICATIONS

Okano et al., "Process Integration Technology and Device Characteristics of CMOS FinFET on Bulk Silicon Substrate with sub-10 nm Fin Width and 20 nm Gate Length," 2005 IEEE.

*Primary Examiner* — Zandra Smith
*Assistant Examiner* — Sophia Nguyen
(74) *Attorney, Agent, or Firm* — Amerson Law Firm, PLLC

(57) ABSTRACT

One illustrative method disclosed herein includes forming a plurality of spaced-apart trenches in a semiconducting substrate to thereby define a fin structure for the device, forming a local isolation region within each of the trenches, forming a sacrificial gate structure on the fin structure, wherein the sacrificial gate structure comprises at least a sacrificial gate electrode, and forming a layer of insulating material above the fin structure and within the trench above the local isolation region. In this example, the method further includes performing at least one etching process to remove the sacrificial gate structure to thereby define a gate cavity, after removing the sacrificial gate structure, performing at least one etching process to form a recess in the local isolation region, and forming a replacement gate structure that is positioned in the recess in the local isolation region and in the gate cavity.

20 Claims, 9 Drawing Sheets

(56) References Cited

U.S. PATENT DOCUMENTS

| | | |
|---|---|---|
| 2010/0264494 A1* | 10/2010 | Doyle et al. ............ 257/365 |
| 2011/0020987 A1* | 1/2011 | Hareland et al. ............ 438/151 |
| 2011/0049613 A1 | 3/2011 | Yeh et al. |
| 2011/0068407 A1* | 3/2011 | Yeh et al. ............ 257/369 |
| 2011/0133292 A1* | 6/2011 | Lee et al. ............ 257/401 |
| 2011/0147812 A1* | 6/2011 | Steigerwald et al. ............ 257/288 |
| 2011/0169101 A1 | 7/2011 | Doornbos et al. |
| 2011/0198676 A1 | 8/2011 | Luo et al. |
| 2013/0175659 A1* | 7/2013 | Liu ............ 257/506 |
| 2013/0221443 A1* | 8/2013 | Lin et al. ............ 257/368 |
| 2014/0035043 A1* | 2/2014 | Lee et al. ............ 257/365 |

* cited by examiner

METHODS OF FORMING BULK FINFET DEVICES WITH REPLACEMENT GATES SO AS TO REDUCE PUNCH THROUGH LEAKAGE CURRENTS

BACKGROUND OF THE INVENTION

1. Field of the Invention

Generally, the present disclosure relates to the manufacturing of sophisticated semiconductor devices, and, more specifically, to various methods of forming bulk FinFET semiconductor devices so as to reduce punch through leakage currents.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative FinFET device, which is a 3-dimensional structure. More specifically, in a FinFET, a generally vertically positioned fin-shaped active area is formed and a gate electrode encloses both sides and an upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the depletion width under the channel and thereby reduce so-called short channel effects. Also, in a FinFET, the junction capacitance at the drain region of the device is greatly reduced, which tends to reduce at least some short channel effects. However, FinFET devices still exhibit some performance-limiting characteristics. One such characteristic that is detrimental to all forms of semiconductor devices, both FinFETs and planar FETs, is off-state leakage currents. Ideally, off-state leakage current is minimized to increase device performance. In the case of a FinFET device, it has been noted that the punch through leakage current densities vary along the vertical length of the fins with the current densities being much greater at the bottom of the fins proximate the local isolation regions of the device. See, e.g., Okano et al., "Process Integration Technology and Device Characteristics of CMOS FinFET on Bulk Silicon Substrate with sub-10 nm Fin Width and 20 nm Gate Length," *IEDM Technical Digest*, pp. 721-724, 2005. Efforts have been made in the past in attempts to reduce such punch through leakage currents in FinFET devices. For example, in some cases, efforts have been made to form so-called punch through stoppers at the base of the fins by implantation and/or oxidizing the bottom portion of the fin to effectively merge the local isolation regions together.

The present disclosure is directed to various methods of forming bulk FinFET semiconductor devices so as to reduce punch through leakage currents.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming bulk FinFET semiconductor devices so as to reduce punch through leakage currents. One illustrative method disclosed herein includes forming a plurality of spaced-apart trenches in a semiconducting substrate to thereby define a fin structure for the device, forming a local isolation region within each of the trenches, forming a sacrificial gate structure on the fin, wherein the sacrificial gate structure comprises at least a sacrificial gate electrode, and forming a layer of insulating material above the fin and within the trench above the local isolation region. In this example, the method further includes performing at least one etching process to remove the sacrificial gate structure to thereby define a gate cavity, after removing the sacrificial gate structure, performing at least one etching process to form a recess in the local isolation region and forming a replacement gate structure that is positioned in the recess in the local isolation region and in the gate cavity.

Another illustrative method disclosed herein includes forming a plurality of spaced-apart trenches in a semiconducting substrate to thereby define a fin structure for the device, forming a local isolation region within each of the trenches, forming a sacrificial gate structure on the fin, wherein the sacrificial gate structure comprises at least a sacrificial gate electrode and a sacrificial gate insulation layer, forming sidewall spacers proximate the sides of the sacrificial gate structure and forming a layer of insulating material above the fin and within the trench above the local isolation region. In this example, the method further includes performing at least one etching process to remove the sacrificial gate structure to thereby form a gate cavity defined by the sidewall spacers, after removing the sacrificial gate structure, performing at least one etching process to form a recess in the local isolation region and forming a replacement gate structure that is positioned in the recess in the local isolation region and in the gate cavity, wherein the replacement gate structure is comprised of a replacement gate insulation material and a replacement gate electrode.

BRIEF DESCRIPTION OF THE DRAWINGS

The disclosure may be understood by reference to the following description taken in conjunction with the accompanying drawings, in which like reference numerals identify like elements, and in which.

Figure 1A:
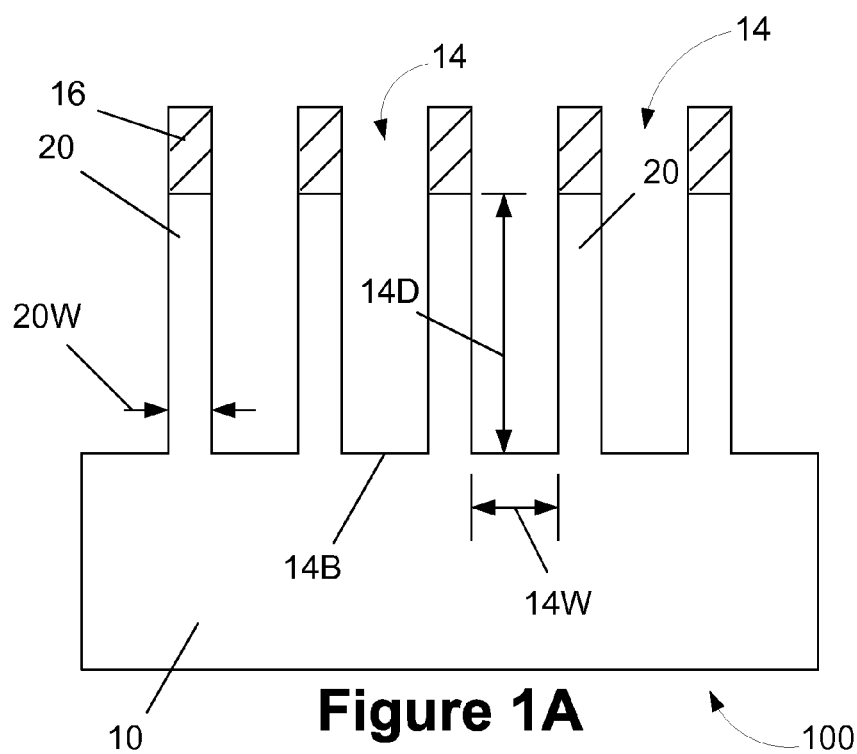
FIGS. 1A-1Q depict one illustrative method disclosed herein for various methods of forming bulk FinFET semiconductor devices so as to reduce punch through leakage currents.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming bulk FinFET semiconductor devices so as to reduce punch through leakage currents. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIG. 1A is a simplified view of an illustrative FinFET semiconductor device 100 at an early stage of manufacturing that is formed above a semiconducting substrate 10. The substrate 10 may have a variety of configurations, such as the depicted bulk silicon configuration. The substrate 10 may be made of silicon or it may be made of materials other than silicon. At the point of fabrication depicted in FIG. 1A, a patterned mask layer 16, such as a patterned hard mask layer, has been formed above the substrate 10 using known photolithography and etching techniques. The patterned mask layer 16 is intended to be representative in nature as it could be comprised of a variety of materials, such as, for example, a photoresist material, silicon nitride, silicon oxynitride, silicon dioxide, etc. Moreover, the patterned mask layer 16 could be comprised of multiple layers of material, such as, for example, a pad oxide layer (not shown) that is formed on the substrate 10 and a silicon nitride layer (not shown) that is formed on the pad oxide layer. Thus, the particular form and composition of the patterned mask layer 16 and the manner in which it is made should not be considered a limitation of the present invention. In the case where the patterned mask layer 16 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application. In one illustrative embodiment, the patterned mask layer 16 is a hard mask layer of silicon nitride that is initially formed by performing a CVD process and thereafter patterned using known sidewall image transfer techniques and/or photolithographic techniques combined with performing known etching techniques.

With continuing reference to FIG. 1A, an etching process, such as a dry or wet etching process, is performed on the substrate 10 through the patterned mask layer 16 to form a plurality of trenches 14 with a bottom surface 14B. This etching process results in the definition of a plurality of fins 20. The overall size, shape and configuration of the trenches 14 and fins 20 may vary depending on the particular application. The depth 14D and width 14W of the trenches 14 may vary depending upon the particular application. In one illustrative embodiment, based on current day technology, the depth 14D of the trenches 14 may range from approximately 30-200 nm and the width 14W of the trenches 14 may range from about 20-100 nm. In some embodiments, the fins 20 may have a width 20W within the range of about 5-30 nm. In the illustrative example depicted in FIGS. 1A-1Q, the trenches 14 and fins 20 are all of a uniform size and shape. However, such uniformity in the size and shape of the trenches 14 and the fins 20 is not required to practice at least some aspects of the inventions disclosed herein. In the example depicted herein, the trenches 14 are formed by performing an anisotropic etching process that results in the trenches 14 having a schematically depicted, generally rectangular configuration. In an actual real-world device, the sidewalls of the trenches 14 may be somewhat inwardly tapered, although that configuration is not depicted in the drawings. In some cases, the trenches 14 may have a reentrant profile near the bottom of the trenches 14. To the extent the trenches 14 are formed by performing a wet etching process, the trenches 14 may tend to have a more rounded configuration or non-linear configuration as compared to the generally rectangular configuration of the trenches 14 that are formed by performing an anisotropic etching process. Thus, the size and configuration of the trenches 14, and the manner in which they are made, should not be considered a limitation of the present invention. For ease of disclosure, only the substantially rectangular trenches 14 will be depicted in subsequent drawings.

Figure 1B:
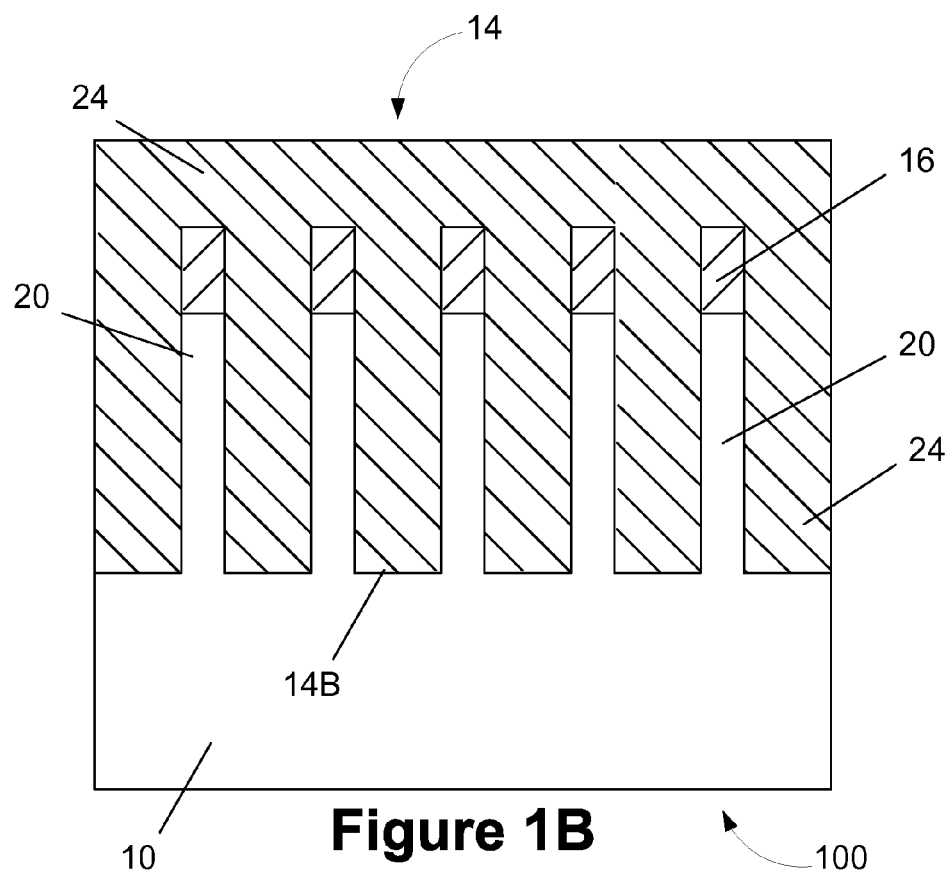

In FIG. 1B, a layer of insulating material 24 has been blanket-deposited such that it overfills the trenches 14. The layer of insulating material 24 may be made of a variety of materials, such as silicon dioxide, etc. The layer of insulating material 24 may be formed by performing any of a variety of known processes, such as a CVD process, etc.

Figure 1C:
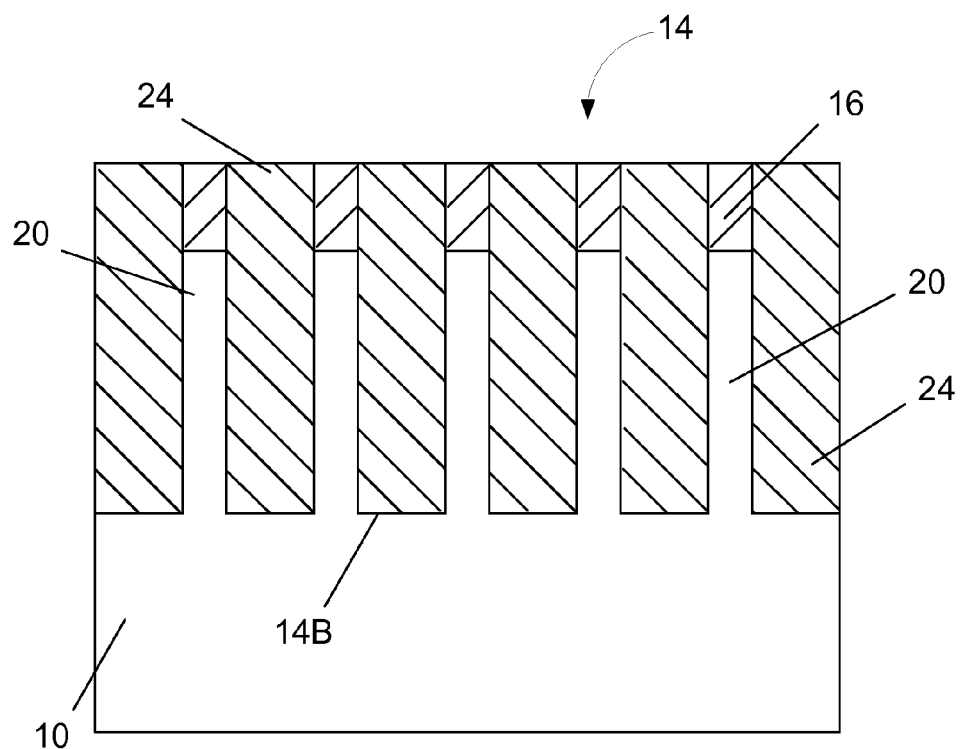

FIG. 1C depicts the device 100 after a chemical mechanical polishing (CMP) process has been performed on the layer insulating material 24 using the patterned hard mask layer 16 as a polish-stop layer.

Figure 1D:
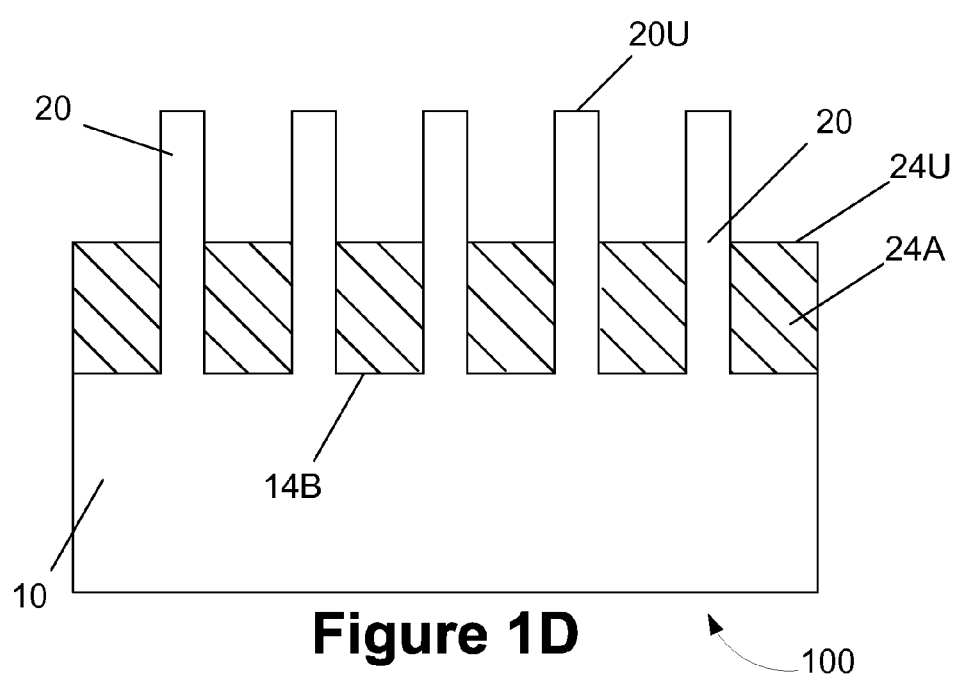

As shown in FIG. 1D, an etching process is performed to recess the layer of insulating material 24 to define local isolation regions 24A for the device 100. In one illustrative embodiment, after the etching process is completed, the local isolation regions 24A may have a thickness of about 20-200 nm. As depicted, the upper surface 24U of the local isolation regions 24A is below the upper surface 20U of the fins 20

Figure 1E:
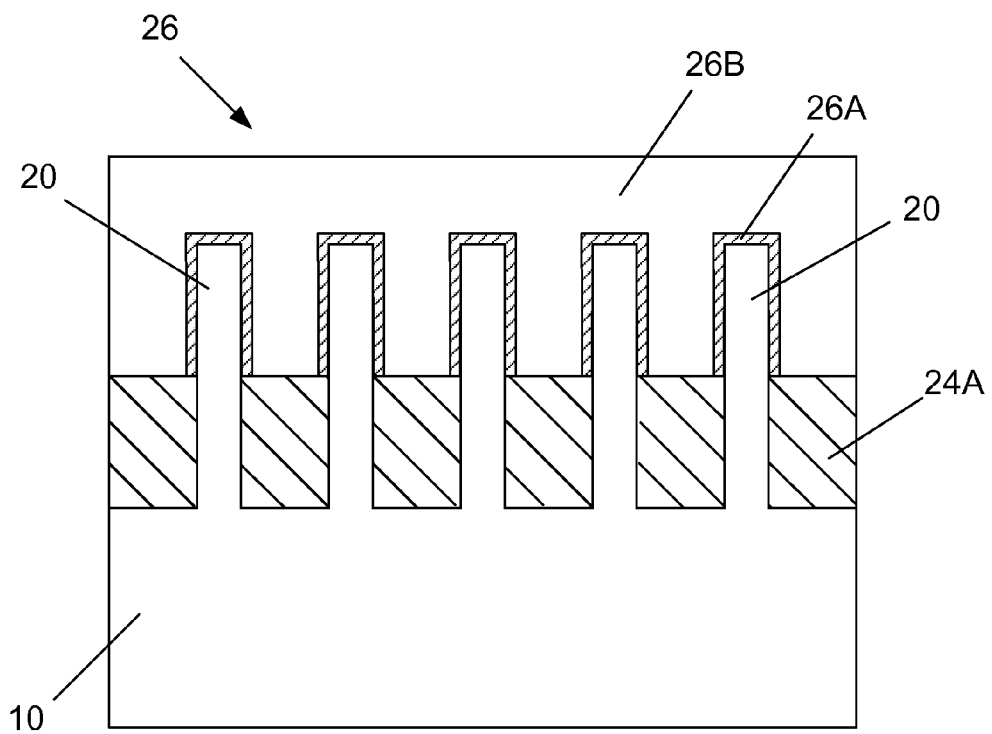
Figure 1F:
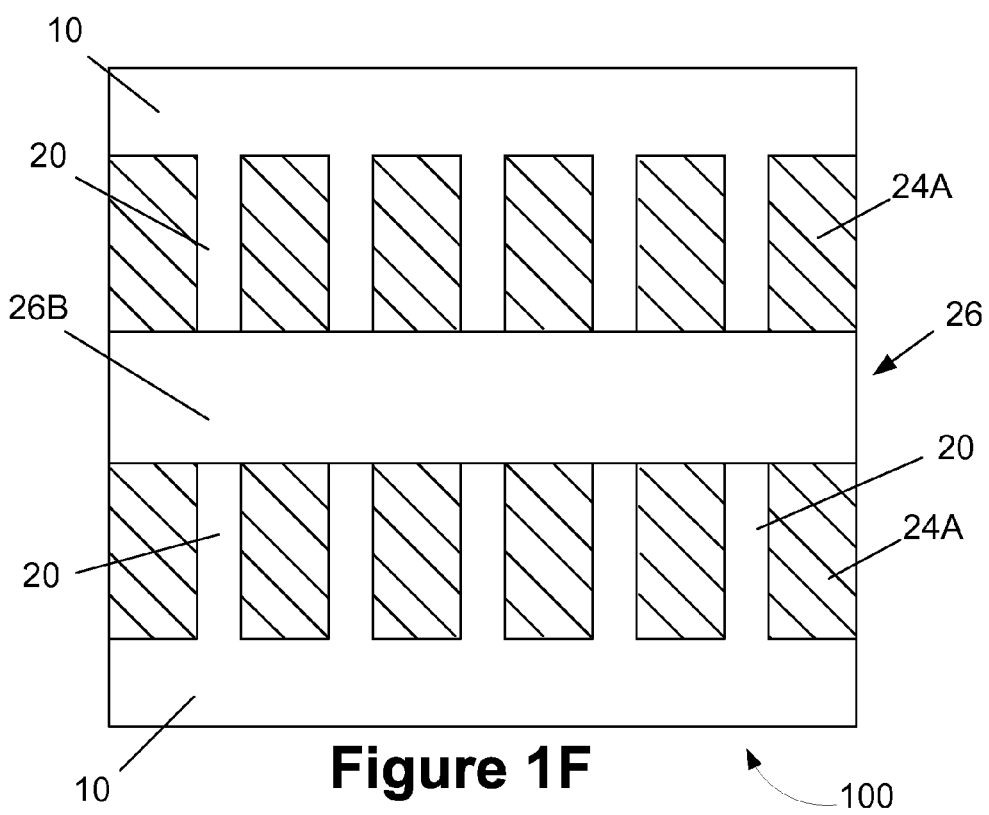

Next, as shown in FIGS. 1E (cross-sectional view) and 1F (plan view of the device shown in FIG. 1E), in one illustrative embodiment, a sacrificial gate structure 26 comprised of a sacrificial gate insulation layer 26A and a sacrificial gate electrode 26B is formed on the device 100. The sacrificial gate insulation layer 26A may be made of a variety of materials such as, for example, silicon dioxide, etc., and it may be formed by a variety of processes, e.g., an oxidation process, a CVD process, etc. In the illustrative example depicted in FIG. 1E, the sacrificial gate insulation layer 26A is comprised of a thermally grown layer of silicon dioxide. The sacrificial gate electrode 26B may also be made of a variety of materials, e.g., polysilicon, amorphous silicon, SiGe, etc., and it may be formed by a CVD process. After the materials for the sacrificial gate structure 26B are formed, one or more etching processes may be performed on the layer of material to define the sacrificial gate structure 26B. In some applications, the gate insulation layer 26A depicted in FIG. 1E may not be sacrificial in nature. That is, the gate insulation layer 26A may be the final gate insulation layer for the completed device 100.

Figure 1G:
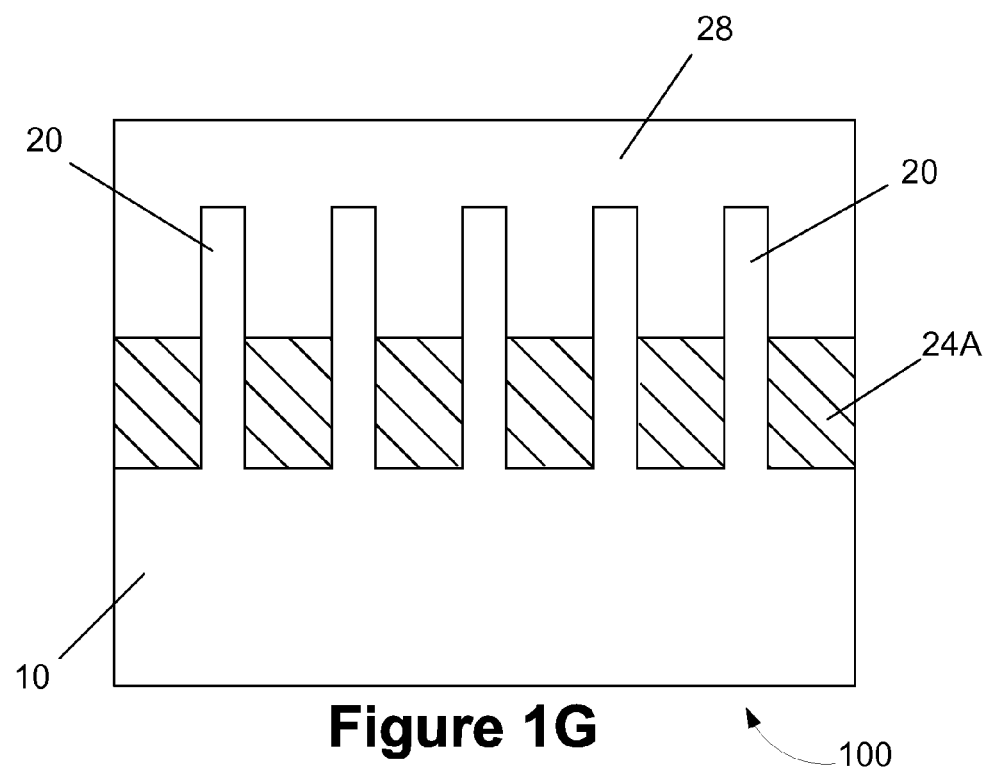
Figure 1H:
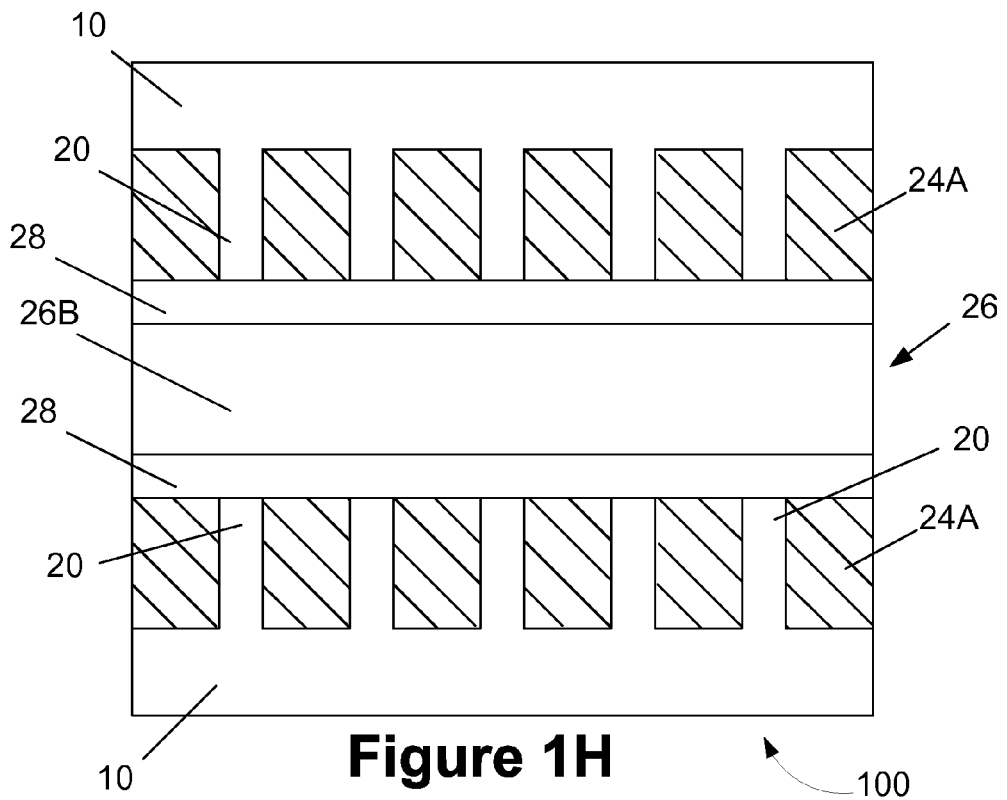

Next, as shown in FIGS. 1G (a cross-sectional view) and 1H (a plan view of the device shown in FIG. 1G), in one illustrative embodiment, one or more sidewall spacers 28 are formed proximate the sacrificial gate structure 26. The sidewall spacers 28 may be made of a variety of materials, such as, for example, silicon nitride. The sidewall spacers 28 may be formed by conformably depositing a layer of spacer material and thereafter performing an anisotropic etching process. After the sidewall spacers 28 are formed, one or more ion implantation processes may be performed through a patterned mask layer (not shown) to introduce dopant materials (N-type or P-type dopants depending upon the device under construction) into the area of the fins 20 not covered by the sacrificial gate structure 26 and the spacers 28 and thereby form source/drain regions for the device 100. After the dopant materials are introduced into the exposed portions of the fins 20, an anneal process may be performed to activate the implanted dopant material and to repair any damage to the fins 20 due to the implantation process. If desired, metal silicide regions may also be formed at this time on the exposed portions of the fins 20.

Figure 1I:
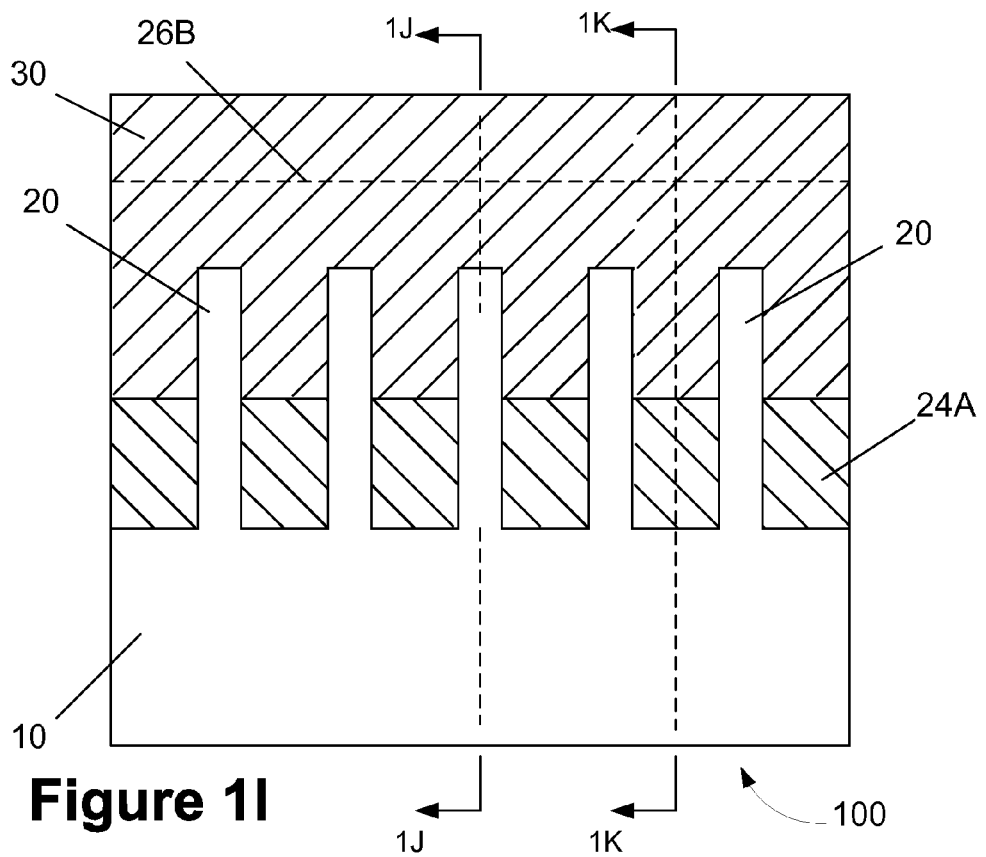
Figure 1J:
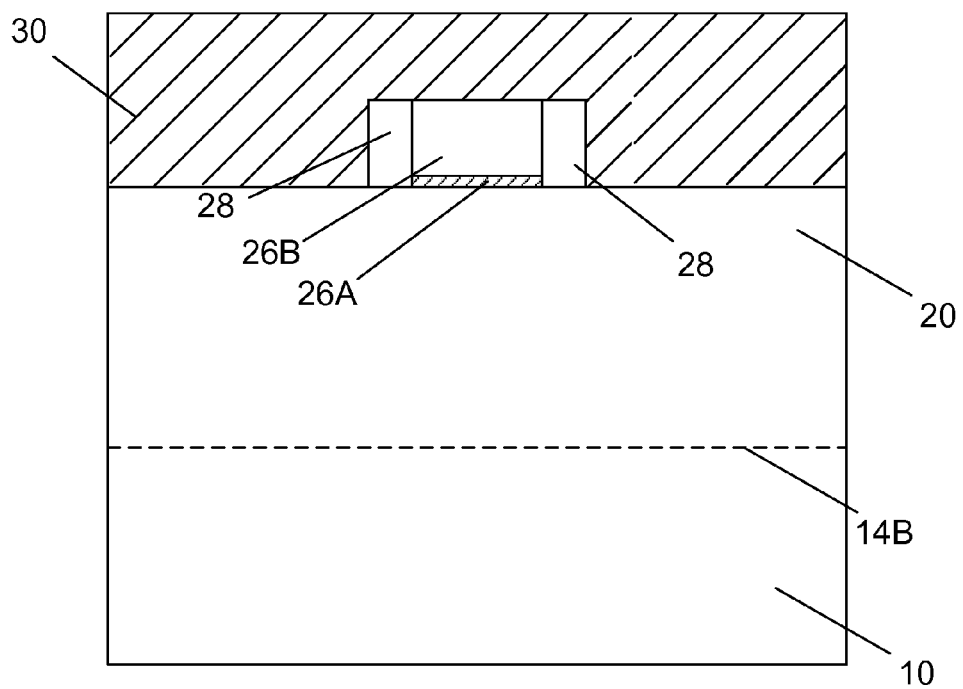
Figure 1K:
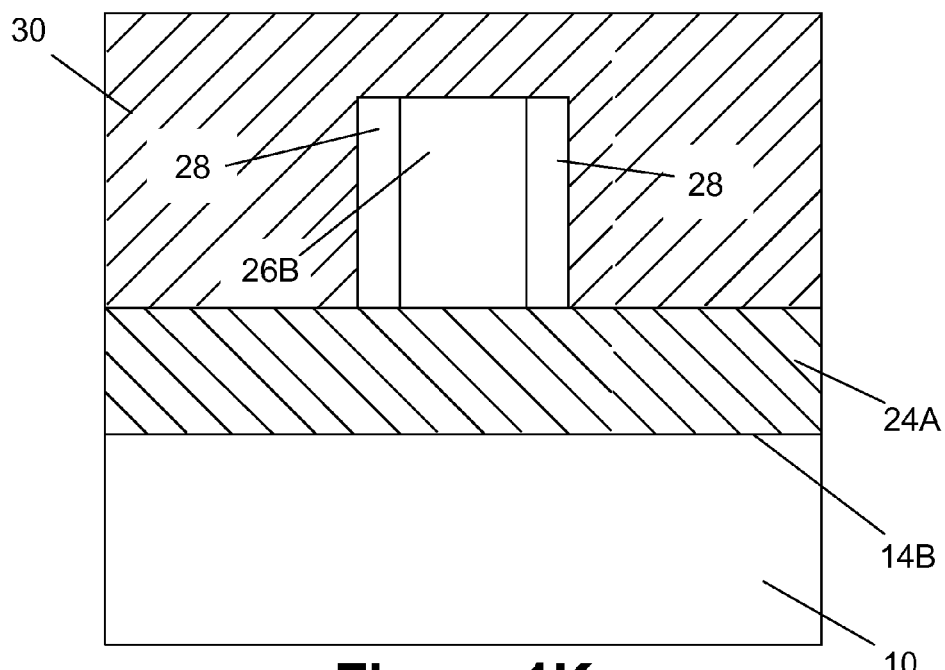

Various additional aspects of the device 100 disclosed herein will now be described with reference to FIGS. 1I-1K, wherein FIG. 1I is a cross-sectional view of the device and FIGS. 1J and 1K are cross-sectional end views of the device 100 taken where indicated in FIG. 1I. More specifically, FIG. 1J is a cross-sectional end view taken through one of the illustrative fins 20, while FIG. 1K is a cross-sectional end view taken through the middle of one of the trenches 14. As shown in these drawings, in one illustrative embodiment, a second layer of insulating material 30 is formed on the device 100 such that it covers the upper surface of the sacrificial gate electrode 26B (depicted in dashed lines in FIG. 1I). The second layer of insulating material 30 may be comprised of the same insulating material as that of the layer of insulating material 24, or it may be formed from a different insulating material, such a low-k insulating material (k value less than 3.5). In one illustrative embodiment, the layer of insulating material 30 may be a layer of silicon dioxide that is formed by performing a blanket CVD deposition process. As can be seen in FIG. 1J, the sacrificial gate insulation layer 26A is positioned on top of the fin 20. In FIG. 1K, since in the example depicted herein the sacrificial gate insulation layer 26A was formed by a deposition process, only the sacrificial gate electrode 26B contacts the local isolation regions 24A at the cross-section depicted in FIG. 1K. Had the sacrificial gate insulation layer 26A been formed by a deposition process, then the sacrificial gate insulation layer 26A would also be present in the view depicted in FIG. 1K in between the sacrificial gate electrode 26B and the local isolation regions 24A.

Figure 1L:
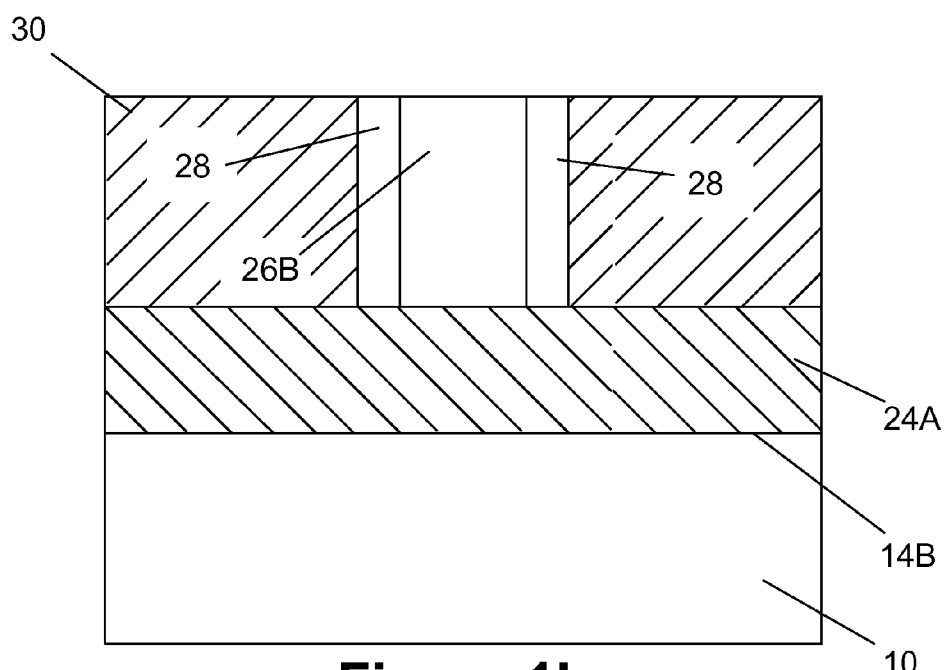

FIG. 1L is a view that is taken from the same perspective as FIG. 1K. FIG. 1L depicts the device 100 after a CMP process has been performed on the second layer of insulating material 30. This CMP process exposes the sacrificial gate electrode 26B for further processing.

Figure 1M:
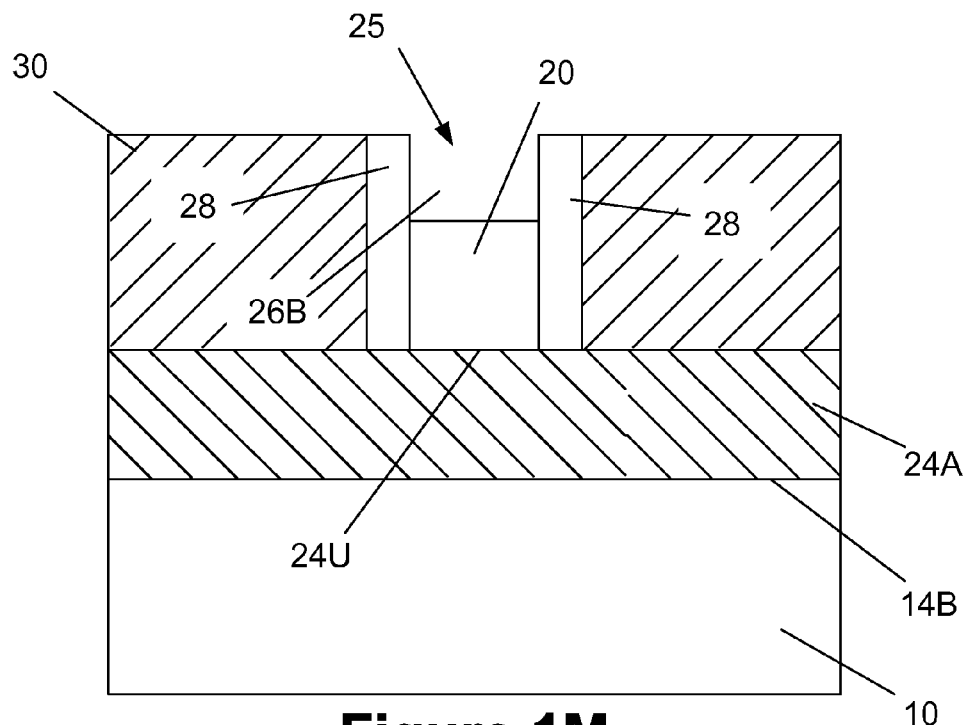
Figure 1N:
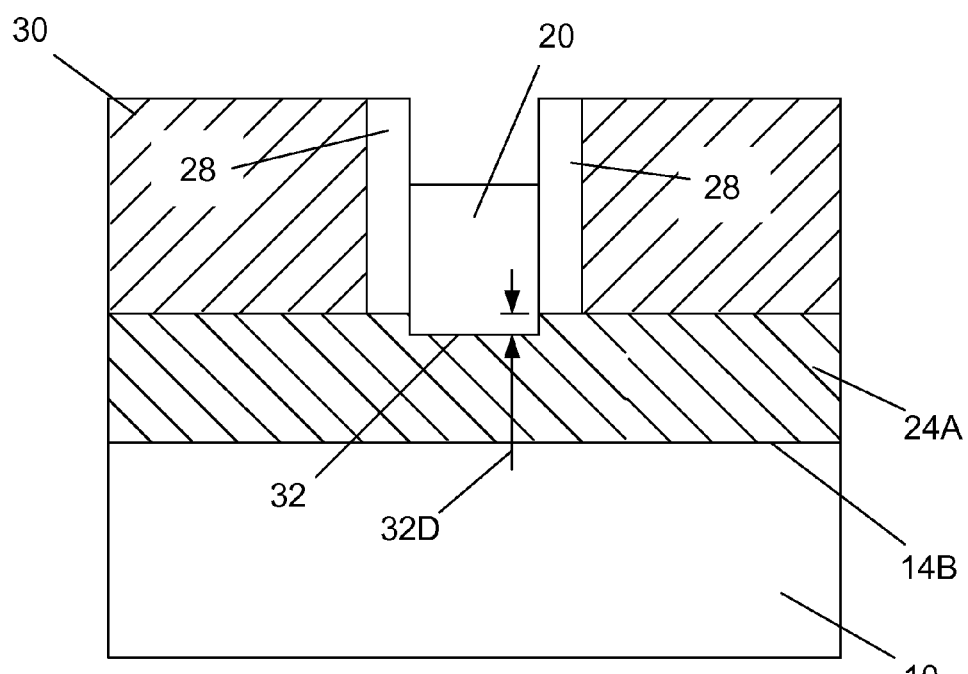

FIGS. 1M-1N are views that are taken from the same perspective as FIGS. 1K-1L. As shown in FIG. 1M, one or more etching processes are performed on the device 100 to remove at least the sacrificial gate electrode 26B. In the depicted example, both the sacrificial gate electrode 26B and the sacrificial gate insulation layer 26A are removed. This process defines a gate cavity 25 that is defined by the spacers 28 and, in the depicted example, exposes the portion of the fin 20 that was previously covered by the sacrificial gate structure 26. In the illustrative example depicted herein, the formation of the gate cavity 25 also exposed the upper surface 24U of the local isolation regions 24A. As shown in FIG. 1N, one or more etching process are performed on the exposed portions of the local isolation regions 24A through the gate cavity 25 to define a recess 32 in the local isolation regions 24A. The depth 32D of the recess 32 may vary depending upon the particular application. In one illustrative embodiment, the depth 32D may be about 5-20 nm. The etching process performed to define the recess 32 may be performed in a self-aligned manner with respect to a spacer or through a patterned etch mask (not shown), such as a patterned photoresist mask.

Figure 1O:
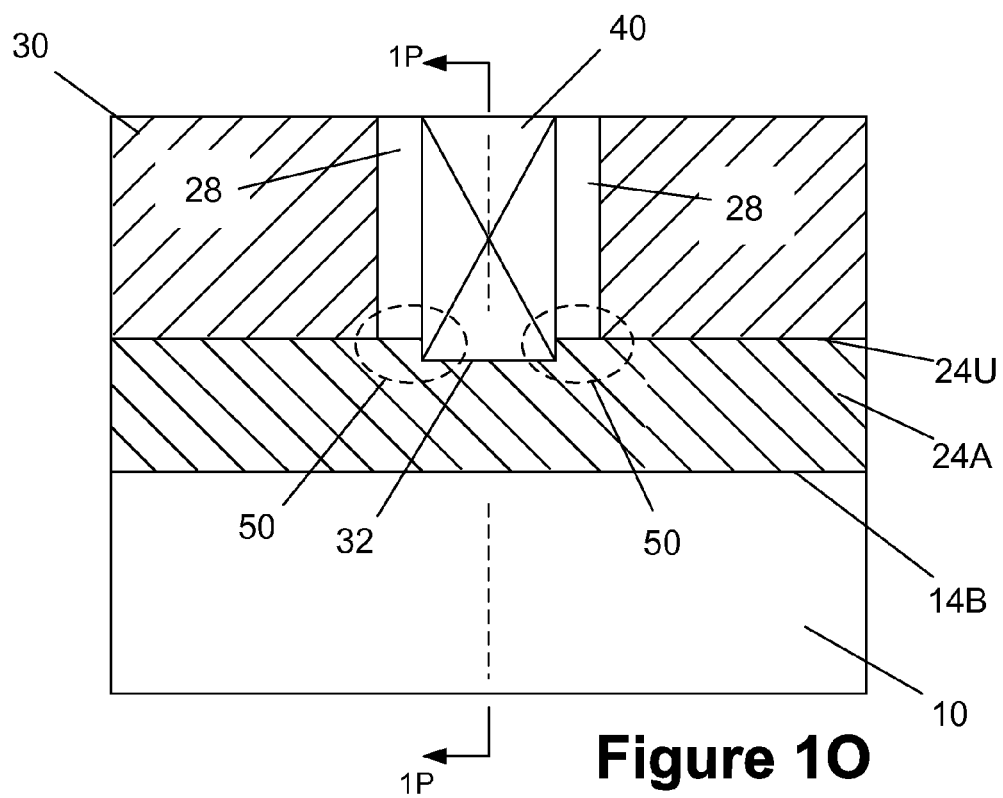
Figure 1P:
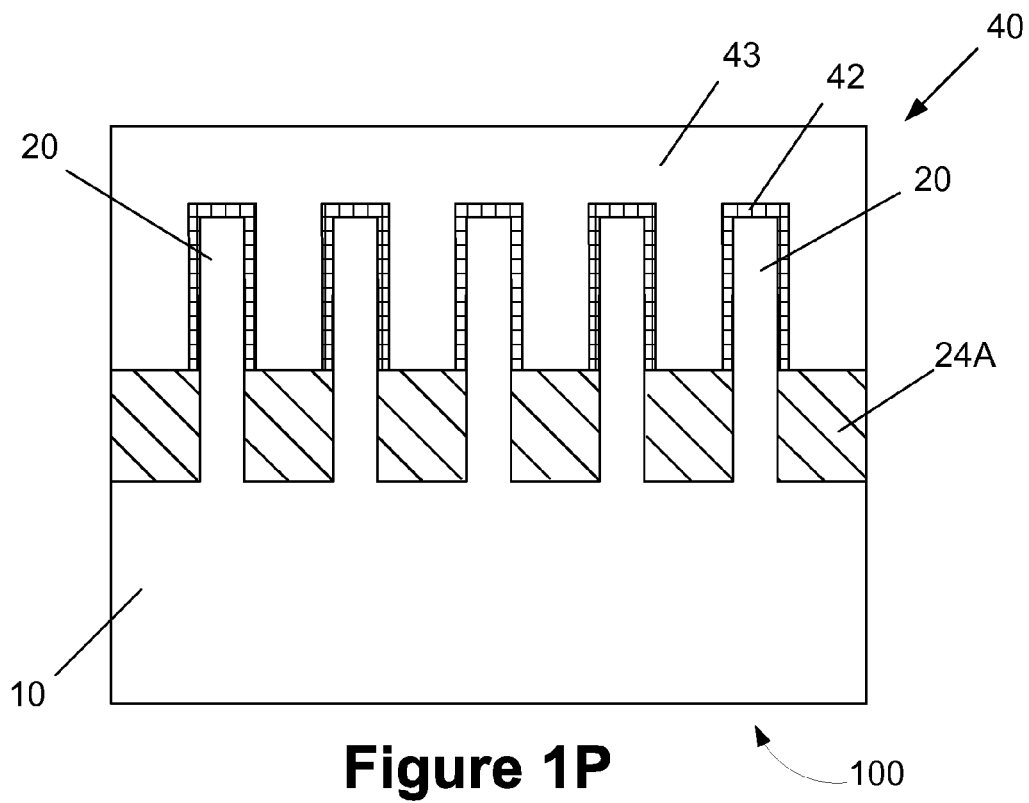

FIG. 1O is a view that is taken from the same perspective as shown in FIGS. 1M-1N, while FIG. 1P is a cross-sectional view of the device taken at the section indicated in FIG. 1O. As shown in FIGS. 1O-1P, the next process operation involves forming a replacement gate structure 40 in the recess 32 and the cavity 25. Forming the replacement gate structure in the recess 32 allows the replacement gate structure 40 to extend further along the vertical axis of the fins 20, i.e., to extend into the recess 32 below the upper surface 24U of the local isolation regions 24A within the dashed regions 50 depicted in FIG. 1O. With this configuration, the replacement gate structure 40 has more control and influence over the region of the fin 20 that intersects the local isolation structures 24A, which may at least reduce the undesirable leakage currents that historically have been very high at the location where fins of a FinFET device intersect local isolation regions. This benefit is achieved without degrading mobility by performing punch through implants, and without performing the complex process operations involved in oxidizing the bottom of the fins.

The gate structure 40 is depicted schematically as it is intended to be representative of any type of material that may be used for gate electrodes and/or gate insulation layers on semiconductor devices. As noted earlier, in some applications, only the sacrificial gate electrode 26B may be removed and the gate insulation layer 26A may be used as the final gate insulation layer for the device 100. Additionally, in some applications, the materials of construction for the replacement gate structure 40 may be the same as the materials used for the sacrificial gate insulation layer 26A and/or the sacrificial gate electrode 26B. For example, in one illustrative example, both the sacrificial gate insulation layer 26A and the replacement gate insulation layer (not shown in FIG. 1O) may be comprised of silicon dioxide, and both the sacrificial gate electrode 26B and the replacement gate electrode may be made of polysilicon. In one particularly illustrative example, the replacement gate structure 40 may be comprised of one or more so-called high-k insulating materials (k value greater than 10) and one or more metal layers. In some cases, the replacement gate structure 40 may also be comprised of a layer of polysilicon formed above any such metal layers.

In general, the replacement gate structure 40 may be formed in the gate cavity 25 using any of a variety of known techniques. For example, the replacement gate insulation layer may be formed by performing a conformable deposition process or by performing an oxidation process (depending upon the material used). To the extent any metal layers are used in the replacement gate structure, such metal layers may be deposited by performing a physical vapor deposition (PVD) process. If polysilicon or other similar material is part of the replacement gate structure 40, it may be formed by performing a CVD process. To the extent that any of the material used in manufacturing the replacement gate structure 40 overfills the gate cavity 25, a CMP process may be performed to remove any excess material positioned outside of the gate cavity 25. FIG. 1O depicts the device after such a CMP process has been performed.

FIG. 1P is a specific example of the device 100 wherein the replacement gate structure 40 is comprised of a replacement gate insulation layer 42 and a replacement gate electrode 43. In this illustrative example, the replacement gate insulation layer 42 was formed by performing an oxidation process.

Figure 1Q:
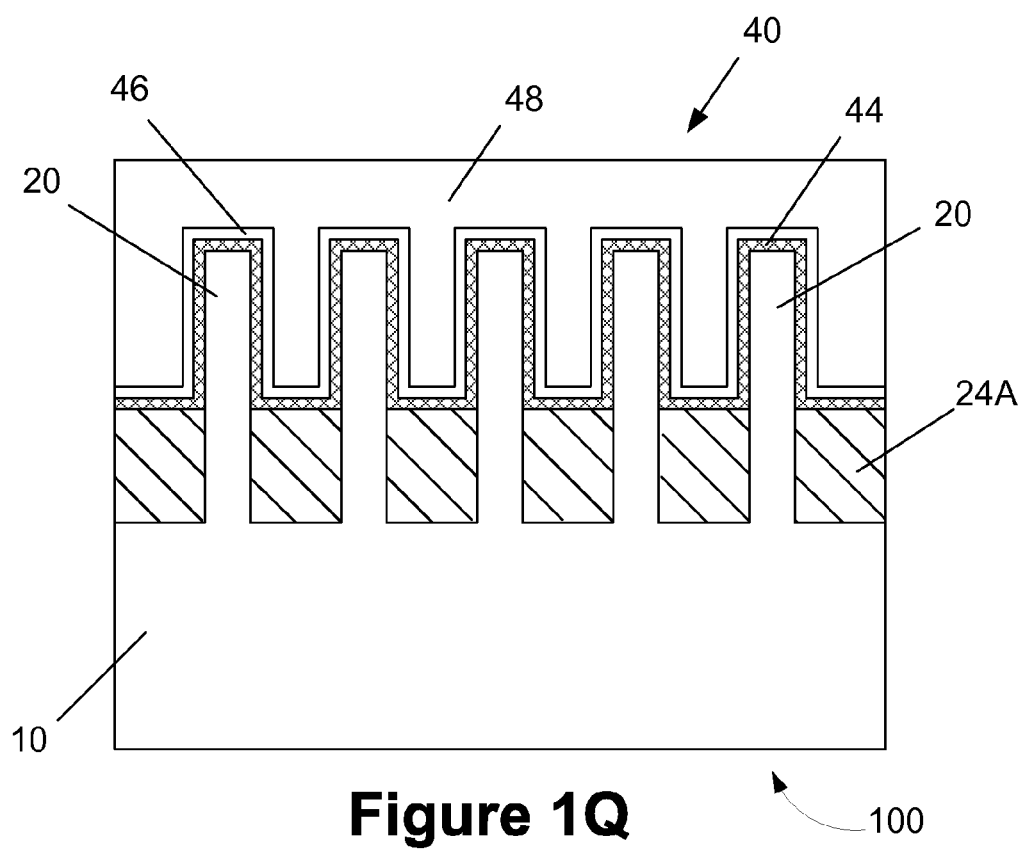

FIG. 1Q is a specific example of the device 100 wherein the replacement gate structure 40 is comprised of a replacement gate insulation layer 44 comprised of a high-k material, a metal layer 46 and a polysilicon material 48. In this illustrative example, the combination of the metal layer 46 and the polysilicon material 48 is the replacement gate electrode. In this illustrative example, the replacement gate insulation layer 44 and the illustrative metal layer 46 were formed by performing a conformable deposition process. The polysilicon material was formed by performing a CVD process. In the case where a high-k insulation layer is used, it may be any of a variety of different high-k materials, such as, for example, tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, to the extent that the replacement gate structure 40 includes one or more metal layers, such layers may be made of a variety of different metals or metal compounds, such as, for example, titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a FinFET device, comprising:
   forming a plurality of spaced-apart trenches in a semiconducting substrate, said trenches defining a fin structure for said device, said fin structure having an upper surface;
   forming a local isolation region within each of said trenches, said local isolation region having an upper surface that is positioned below said upper surface of said fin structure;
   after forming said local isolation regions, forming a sacrificial gate structure on said fin structure, wherein forming said sacrificial gate structure comprises forming a gate insulation layer on sidewall surfaces and said upper surface of said fin and forming a sacrificial gate electrode above said gate insulation layer;
   forming a layer of insulating material above said fin structure and within said trench above said local isolation region;
   performing at least one etching process to remove said sacrificial gate structure to thereby define a gate cavity;
   after removing said sacrificial gate structure, performing at least one etching process to form a recess in said local isolation region, wherein sidewalls of said recess are substantially aligned with sidewalls of said gate cavity; and
   forming a replacement gate structure that is positioned in said recess in said local isolation region and in said gate cavity.

2. The method of claim 1, wherein said gate insulation layer comprises a sacrificial gate insulation layer.

3. The method of claim 2, wherein said sacrificial gate insulation layer is comprised of silicon dioxide and said sacrificial gate electrode is comprised of polysilicon.

4. The method of claim 1, wherein said replacement gate structure is comprised of at least a replacement gate electrode.

5. The method of claim 4, wherein said replacement gate structure is further comprised of a replacement gate insulation layer.

6. The method of claim 1, wherein said sacrificial gate structure and said replacement gate structure are comprised of different materials.

7. The method of claim 1, wherein said replacement gate structure is made of a material that is the same as a material in said sacrificial gate structure.

8. The method of claim 1, wherein said replacement gate structure is comprised of at least one layer of metal.

9. The method of claim 8, wherein said replacement gate structure is comprised of at least one layer of a high-k insulating material.

10. A method of forming a FinFET device, comprising:
forming a plurality of spaced-apart trenches in a semiconducting substrate, said trenches defining a fin structure for said device, said fin structure having an upper surface;
forming a local isolation region within each of said trenches, said local isolation region having an upper surface that is positioned below said upper surface of said fin structure;
after forming said local isolation regions, forming a sacrificial gate structure on said fin structure, wherein forming said sacrificial gate structure comprises forming at least a sacrificial gate insulation layer on sidewall surfaces and said upper surface of said fin and forming a sacrificial gate electrode above said gate insulation layer;
forming at least one sidewall spacer proximate opposite sides of said sacrificial gate structure;
forming a layer of insulating material above said fin structure and within said trench above said local isolation region;
performing at least one etching process to remove said sacrificial gate structure to thereby define a gate cavity and expose said local isolation region, wherein said gate cavity is defined by said sidewall spacers;
after removing said sacrificial gate structure, performing at least one etching process to form a recess in said local isolation region by using said sidewall spacers as an etch mask, wherein a lateral size of said cavity is substantially defined by said sidewall spacers; and
forming a replacement gate structure that is positioned in said recess in said local isolation region and in said gate cavity, wherein said replacement gate structure is comprised of a replacement gate insulation layer and a replacement gate electrode.

11. The method of claim 10, wherein said sacrificial gate insulation layer is comprised of silicon dioxide and said sacrificial gate electrode is comprised of polysilicon.

12. The method of claim 11, wherein said replacement gate insulation layer is comprised of silicon dioxide and said replacement gate electrode is comprised of polysilicon.

13. The method of claim 12, wherein said replacement gate insulation layer is comprised of at least one layer of a high-k insulating material.

14. The method of claim 10, wherein said replacement gate electrode is comprised of at least one layer of metal.

15. A method of forming a FinFET device, comprising:
forming a plurality of spaced-apart trenches in a semiconducting substrate, said trenches defining a fin structure for said device, said fin structure having an upper surface;
forming a local isolation region within each of said trenches, said local isolation region having an upper surface that is positioned below said upper surface of said fin structure;
after forming said local isolation regions, forming a sacrificial gate structure on said fin structure, wherein forming said sacrificial gate structure comprises forming at least a sacrificial gate insulation layer on sidewall surfaces and said upper surface of said fin and forming a sacrificial gate electrode above said gate insulation layer;
forming at least one sidewall spacer proximate opposite sides of said sacrificial gate structure;
forming a layer of insulating material above said fin structure and above said sacrificial gate structure and within said trench above said local isolation region;
performing a chemical mechanical polishing process on said layer of insulating material to expose at least an upper surface of said sacrificial gate electrode;
after performing said chemical mechanical polishing process, performing at least one etching process to remove said sacrificial gate structure to thereby define a gate cavity and expose said local isolation region, wherein said gate cavity is defined by said sidewall spacers;
after removing said sacrificial gate structure, performing at least one etching process to form a recess in said local isolation region, wherein sidewalls of said recess are defined by sidewalls of said gate cavity; and
forming a replacement gate structure that is positioned in said recess in said local isolation region and in said gate cavity, wherein said replacement gate structure is comprised of a replacement gate insulation layer and a replacement gate electrode.

16. The method of claim 15, wherein said sacrificial gate insulation layer is comprised of silicon dioxide and said sacrificial gate electrode is comprised of polysilicon.

17. The method of claim 16, wherein said replacement gate insulation layer is comprised of silicon dioxide and said replacement gate electrode is comprised of polysilicon.

18. The method of claim 15, wherein said replacement gate electrode is comprised of at least one layer of metal.

19. The method of claim 18, wherein said replacement gate insulation layer is comprised of at least one layer of a high-k insulating material.

20. The method of claim 15, wherein performing said chemical mechanical polishing process comprises exposing a portion of said sidewall spacers.

* * * * *